(12) United States Patent
Kobayashi et al.

(10) Patent No.: US 10,369,667 B2
(45) Date of Patent: Aug. 6, 2019

(54) SINTERED BODY MADE FROM SILVER FINE PARTICLES

(71) Applicant: NAMICS CORPORATION, Niigata-shi, Niigata (JP)

(72) Inventors: Makoto Kobayashi, Niigata (JP); Koji Sasaki, Niigata (JP)

(73) Assignee: NAMICS CORPORATION, Nigata (JP)

( * ) Notice: Subject to any disclaimer, the term of this patent is extended or adjusted under 35 U.S.C. 154(b) by 974 days.

(21) Appl. No.: 14/382,617

(22) PCT Filed: Feb. 26, 2013

(86) PCT No.: PCT/JP2013/054906
§ 371 (c)(1),
(2) Date: Sep. 3, 2014

(87) PCT Pub. No.: WO2013/133085
PCT Pub. Date: Sep. 12, 2013

(65) Prior Publication Data
US 2015/0041974 A1    Feb. 12, 2015

(30) Foreign Application Priority Data

Mar. 5, 2012  (JP) ................................. 2012-048579

(51) Int. Cl.
| | |
|---|---|
| *B23K 35/30* | (2006.01) |
| *B22F 1/00* | (2006.01) |
| *B22F 3/10* | (2006.01) |
| *C22C 5/06* | (2006.01) |
| *H01L 23/00* | (2006.01) |
| *B82Y 30/00* | (2011.01) |
| *B23K 1/00* | (2006.01) |
| *B23K 35/365* | (2006.01) |
| *B22F 9/24* | (2006.01) |

(52) U.S. Cl.
CPC ........ *B23K 35/3006* (2013.01); *B22F 1/0018* (2013.01); *B22F 3/10* (2013.01); *B23K 1/0016* (2013.01); *B23K 35/365* (2013.01); *B82Y 30/00* (2013.01); *C22C 5/06* (2013.01); *H01L 24/13* (2013.01); *H01L 24/16* (2013.01); *H01L 24/29* (2013.01); *H01L 24/81* (2013.01); *H01L 24/83* (2013.01); *B22F 1/0044* (2013.01); *B22F 9/24* (2013.01); *H01L 24/32* (2013.01); *H01L 2224/13339* (2013.01); *H01L 2224/13499* (2013.01); *H01L 2224/165* (2013.01); *H01L 2224/29339* (2013.01); *H01L 2224/29499* (2013.01); *H01L 2224/8184* (2013.01); *H01L 2224/8384* (2013.01); *H01L 2924/01047* (2013.01); *H01L 2924/12042* (2013.01); *H01L 2924/13091* (2013.01)

(58) Field of Classification Search
CPC .................................................. B23K 35/3006
See application file for complete search history.

(56) References Cited

U.S. PATENT DOCUMENTS

2009/0230172 A1    9/2009  Ogashiwa et al.

FOREIGN PATENT DOCUMENTS

| JP | 2006-183072 A | 7/2006 |
| JP | 2007-324523 A | 12/2007 |
| JP | 2008-010703 A | 1/2008 |
| JP | 2008-133527 A | 6/2008 |
| JP | 2008-210954 A | 9/2008 |
| JP | 2010-131669 A | 6/2010 |
| JP | 2010-192525 A | 9/2010 |
| JP | 2011-238779 A | 11/2011 |

OTHER PUBLICATIONS

Machine translation of JP2008-133527 (Japanese document published Jun. 12, 2008).*
International Search Report dated Nov. 27, 2014 for PCT/JP2013/054906.
International Preliminary Report on Patentability (IPRP) including Written Opinion dated Sep. 9, 2014, issued in parent International Application No. PCT/JP2013/054906.

* cited by examiner

*Primary Examiner* — Christopher S Kessler
(74) *Attorney, Agent, or Firm* — Holtz, Holtz & Volek PC

(57) ABSTRACT

A sintered body of silver fine particles for a bonding member to bond components of a semiconductor device, wherein an activation energy for creep of the sintered body of the silver fine particles is from 0.4 to 0.75 times that of an activation energy for a lattice diffusion of bulk silver.

18 Claims, 5 Drawing Sheets

SINTERED BODY MADE FROM SILVER FINE PARTICLES

CROSS-REFERENCE TO RELATED APPLICATION

This application is a United States national phase application of International Application PCT/JP2013/054906 filed on Feb. 26, 2013.

TECHNICAL FIELD

The present invention relates to a sintered body of silver fine particles that may be used as a bonding member to bond components of a semiconductor device in manufacturing the semiconductor device and a manufacturing method thereof. The present invention particularly relates to a sintered body of silver fine particles that may be used as a bonding member, such as a bump and a die attach material, and a manufacturing method thereof.

BACKGROUND ART

With downsizing, weight reduction, and enhancement in performance of electronics, semiconductor devices have increased calorific values and raised heat density. In addition, in flip-chip type semiconductors, with decrease in dielectric constant of interlayer insulating films, destruction due to stress has become a problem. Further, semiconductors having a wide band gap, such as silicon carbide and gallium nitride, as a power semiconductor are under consideration. A power semiconductor using a semiconductor having a wide band gap is capable of being operated at a higher temperature compared with a conventional silicon semiconductor.

As an electrically conductive bonding material suitable for a semiconductor device operated at a high temperature, Patent Literature 1, for example, describes an electrically conductive bonding material including as an aggregate, a metal fine particle made of a first metal and capable of being sintered at a temperature lower than a melting point of the first metal; and a metal coated resin particle having a resin particle with a particle diameter larger than the metal fine particle coated with a second metal that is capable of being sintered with the first metal.

As a flip chip type semiconductor device and a manufacturing method thereof, Patent Literature 2, for example, describes a method of manufacturing a flip chip type semiconductor device including performing the steps, in this order, of: while electrically connecting an electrode unit provided on a substrate made of an organic material and a bump electrode of a semiconductor device, arranging the semiconductor device on the substrate; plasma processing a surface of the substrate; and, after filling predetermined underfill in a gap between the substrate and the semiconductor device, sealing the gap by thermosetting the predetermined underfill.

In addition, as a method of manufacturing a bump of a semiconductor device, Patent Literature 3, for example, discloses a method of manufacturing a bump for connecting an electrical circuit characterized by applying a predetermined bonding agent for a metal member in dots on a pad unit for connecting an electrical circuit on a semiconductor device or on an electrode unit for connecting an electrical circuit on a substrate and heating at not less than 70° C. and not more than 400° C., thereby sintering the metal particles with each other to form a bump made of metal on the semiconductor device or the substrate. In addition, Patent Literature 3 describes that the predetermined bonding agent for a metal made member is a pasty substance, including (A) heat sintering metal particles having an average particle diameter (median diameter D 50) of more than 0.1 μm and not more than 50 μm and having a melting point of higher than 400° C. and (B) a liquid flux, wherein the metal particles (A) are sintered with each other by being heated at not less than 70° C. and not more than 400° C. to become a porous sinter having a melting point equivalent to the metal particles (A) and also having adhesiveness to the metal member that is in contact during the sintering.

In addition, Patent Literature 4 describes, as a bump of a semiconductor device, a carbon nanotube bump structure that is composed of a carbon nanotube (CNT) and a metal coating portion selectively coating one end side of the carbon nanotube. Further, Patent Literature 4 describes a proposed method of applying a carbon nanotube (CNT) to a bump electrode as a method of suppressing electrode disconnection due to the high current density carried by the semiconductor chip and destruction due to the stress.

Patent Literature 5 describes silver fine particles having an average particle diameter of primary particles from 40 to 350 nm, having a crystallite diameter from 20 to 70 nm, and having 1 to 5 of a ratio of an average particle diameter to a crystallite diameter. The invention described in Patent Literature 5 is described to have an object of providing silver fine particles for a raw material of an electrically conductive paste exhibiting sufficient electrical conductivity at a firing temperature of 200° C. or less and an electrically conductive paste containing the silver fine particles. Specifically, it is described that an electrically conductive paste containing the silver fine particles described in Patent Literature 5 may be used to form a circuit pattern that is more miniaturized.

PRIOR ART LITERATURES

Patent Literature

Patent Literature 1: JP-A-2011-238779
Patent Literature 2: JP-A-2010-192525
Patent Literature 3: JP-A-2010-131669
Patent Literature 4: JP-A-2008-210954
Patent Literature 5: JP-A-2004-375710

DISCLOSURE OF THE INVENTION

A semiconductor device has a structure in which a semiconductor device (semiconductor chip) is connected with a lead frame, a circuit board and the like, for placing a semiconductor device, via a bonding material, such as a die attach material and a bump. In addition, a semiconductor device sometimes also has a structure in which two or more semiconductor devices and silicon interposers are connected with each other via a bonding material. In a semiconductor device in this structure, when heat addition, such as a temperature cycle, is applied, stress is exerted in a connecting portion due to a difference between thermal expansion coefficients of a support and the semiconductor device. Therefore, there is a problem that a crack occurs in the semiconductor device and the bonding material, and an interface between the bonding material and the semiconductor device or the support is separated.

Therefore, there is a demand for a connecting material to allow reduction in the stress on the connecting portion.

In addition, for a rise in a reflow temperature associated with promotion of Pb-free solder and higher operating speed of a semiconductor, a low-K material with low mechanical strength has been used as an interlayer insulating film. In addition, for the purpose of higher speed and heat dissipation of a semiconductor and a narrower pitch of a bump, a bump in a Cu pillar structure has been employed. From these issues, stress exerted on a semiconductor device has been increased. Therefore, a further approach to prevent destruction of a semiconductor device has been required.

Further, in addition to improvement in higher integration and operating speed of a semiconductor device, in the field of power semiconductor, consideration on a semiconductor with a high operating temperature is conducted. From these facts, there is a demand for a connecting material having electrical conductivity and thermal conductivity higher than solder.

In addition, as a material for a die attach material and a bump that are high in thermal conductivity, lead solder and the like have been used generally. However, due to the toxicity of lead, restriction on the use of lead in various countries has become stricter. Therefore, in recent years, there is a demand for a highly thermally conductive die attach material that may be a substitute for lead solder.

Patent Literature 1 describes an electrically conductive bonding material including as an aggregate, a metal fine particle; and a metal coated resin particle of a resin particle with a particle diameter larger than the metal fine particle coated with metal. However, in a case of using such metal coated resin particles, there is a problem that low stress is in trade-off relationship with electrical conductivity and thermal conductivity, and it is difficult to manage both.

Patent Literature 4 describes that a carbon nanotube (CNT) is used as a bump of a semiconductor device. However, process of manufacturing a carbon nanotube is complex, so it is not easy to obtain high productivity.

Therefore, it is an object of the present invention to obtain a bonding member to bond components of a semiconductor device, wherein the bonding member is capable of relieving stress on the semiconductor device and also has electrical conductivity. Specifically, it is an object of the present invention to obtain a bonding member capable of suppressing a crack and the like occurring in a semiconductor device by relieving strain caused by a difference between thermal expansion coefficients of a semiconductor chip, such as an IC, a MOSFET, and an LED, and a support. In addition, an object of the present invention is to obtain a bonding member capable of being used as a highly thermally conductive die attach material as a substitute for lead solder. In addition, it is an object of the present invention to obtain a bonding member capable of efficiently diffusing heat generated from a semiconductor device and very excellent in heat dissipation characteristics.

As a result of intensive efforts by the present inventors, it is surprisingly found that a sintered body of silver fine particles of the present invention exhibits special creep behavior at a low temperature that has not been known conventionally. Based on this finding, the present inventors conducted verification further. As a result, the present inventors have found that, when a sintered body of silver fine particles of the present invention exhibiting the special creep behavior is used as a bonding member of a semiconductor device, it is possible to relieve stress on the semiconductor device, and the present invention was completed. That is, in order to solve the above problems, the present invention has following configurations.

(Configuration 1)

The present invention is a sintered body of silver fine particles for a bonding member to bond components of a semiconductor device, wherein an activation energy for creep of the sintered body of silver fine particles is from 0.4 to 0.75 times that of an activation energy for lattice diffusion of bulk silver. According to the present invention, it is possible to obtain a bonding member to bond components of a semiconductor device that is capable of relieving stress on a semiconductor device and also has electrical conductivity.

(Configuration 2)

In the sintered body of silver fine particles of the present invention, it is preferred that the activation energy for creep of the sintered body of silver fine particles is from 0.4 to 0.7 times that of the activation energy for the lattice diffusion of the bulk silver. The activation energy for creep of the sintered body of silver fine particles is from 0.4 to 0.7 times that of the activation energy for the lattice diffusion of the bulk silver, thereby surely allowing relaxation of stress on the semiconductor device.

(Configuration 3)

In the sintered body of silver fine particles of the present invention, it is preferred that silver fine particles having an average particle diameter of primary particles from 40 to 350 nm, a crystallite diameter from 20 to 70 nm, and also a ratio of the average particle diameter to the crystallite diameter from 1 to 5 is sintered, by heating at a temperature from 130 to 320° C. Predetermined silver find particles are fired, that is, sintered by heating at a predetermined temperature, thereby surely allowing obtaining a sintered body of silver fine particles having the excellent characteristics of the present invention.

(Configuration 4)

In the sintered body of silver fine particles of the present invention, it is possible that a void in the sintered body of silver fine particles is filled with a resin. Even in a case that a resin is included in a void in the sintered body of silver fine particles, it is possible that the sintered body of silver fine particles of the present invention exhibits sufficiently high electrical conductivity and also exhibits special creep behavior.

(Configuration 5)

The present invention is a semiconductor device including a semiconductor chip and a support, both bonded by a bonding member, wherein the bonding member is the sintered body of silver fine particles described above. When the sintered body of silver fine particles of the present invention is used as a bonding member to join a semiconductor chip with a support, the sintered body of silver fine particles of the present invention is very excellent in heat dissipation characteristics, so that it is possible to efficiently diffuse heat generated from the semiconductor device.

(Configuration 6)

The present invention is a semiconductor device including a first semiconductor chip; and a circuit board or a second semiconductor chip, both bonded via a bump, wherein part or all of the bump is the sintered body of silver fine particles described above. When the sintered body of silver fine particles of the present invention is used as a bump, it is possible to suppress a crack and the like occurring in the semiconductor device by relieving strain caused by a difference between thermal expansion coefficients of a chip, such as an MOSFET and an LED, and a substrate.

(Configuration 7)

The present invention is a method of manufacturing a sintered body of silver fine particles for a bonding member to bond components of a semiconductor device, the method including sintering silver fine particles having an average particle diameter of primary particles from 40 to 350 nm, a crystallite diameter from 20 to 70 nm, and also a ratio of the average particle diameter to the crystallite diameter from 1 to 5, by heating at a temperature from 130 to 320° C. According to the manufacturing method of the present invention, it is possible to obtain a bonding member to bond components of the semiconductor device that is capable of relieving stress on the semiconductor device and also has electrical conductivity.

(Configuration 8)

The present invention is a method of manufacturing a semiconductor device having a semiconductor chip and a support bonded by a bonding member, including supplying, on a support, an electrically conductive paste containing silver fine particles having an average particle diameter of primary particles from 40 to 350 nm, a crystallite diameter from 20 to 70 nm, and also a ratio of the average particle diameter to the crystallite diameter from 1 to 5; placing the semiconductor chip on the support in alignment; and sintering the support, the electrically conductive paste, and the semiconductor chip by heating at a temperature from 130 to 320° C. When the method of manufacturing a semiconductor device of the present invention is used, it is possible to relieve stress of bonding between the support and the semiconductor chip, so that it is possible to suppress a crack and the like occurring in the semiconductor device.

(Configuration 9)

The present invention is a method of manufacturing a semiconductor device having a bump, including supplying, to a semiconductor chip, an electrically conductive paste containing silver fine particles having an average particle diameter of primary particles from 40 to 350 nm, a crystallite diameter from 20 to 70 nm, and also a ratio of the average particle diameter to the crystallite diameter from 1 to 5; and sintering the semiconductor chip by heating at a temperature from 130 to 320° C. When the method of manufacturing a semiconductor device of the present invention is used, it is possible to relieve stress of bonding between the support and the semiconductor chip, so that it is possible to suppress a crack and the like occurring in the semiconductor device.

According to the present invention, it is possible to obtain a bonding member to bond components of a semiconductor device that is capable of relieving stress on the semiconductor device and also having electrical conductivity. Specifically, according to the present invention, it is possible to obtain a bonding member capable of suppressing a crack and the like occurring in a semiconductor device by relieving strain caused by a difference between thermal expansion coefficients of a chip, such as a MOSFET and an LED, and a substrate. In addition, according to the present invention, it is possible to obtain a bonding member capable of being used as a highly thermally conductive die attach material as a substitute for lead solder.

In addition, according to the present invention, it is possible to obtain a bonding member capable of efficiently diffusing heat generated from a semiconductor device and very excellent in heat dissipation characteristics. Since having silver as a material, the bonding member of the present invention has very high thermal conductivity in comparison with solder. Since being capable of efficiently diffusing heat generated from a semiconductor device, the bonding member of the present invention has an advantage of being very excellent in heat dissipation characteristics.

The bonding member of the semiconductor device of the present invention having high electrical conductivity and thermal conductivity is capable of satisfying high productivity and economic efficiency in manufacturing the semiconductor device.

MODE FOR CARRYING OUT THE INVENTION

The present invention is a sintered body of silver fine particles for a bonding member to bond components of a semiconductor device (a semiconductor device (a semiconductor chip), a support, and the like), wherein an activation energy for creep of the sintered body of silver fine particles is from 0.4 to 0.75 times that of an activation energy for lattice diffusion of bulk silver. The present inventors have found that a sintered body of silver fine particles of the present invention exhibiting predetermined creep behavior. It is found that, when the sintered body of silver fine particles of the present invention is used as a bonding member, it is possible to obtain a bonding member that is capable of relieving stress on a semiconductor device and also has electrical conductivity. Descriptions are given below to the present invention.

First of all, creep behavior of the sintered body of silver fine particles of the present invention is described. As a result of intensive efforts by the present inventors, it is found that the sintered body of silver fine particles of the present invention exhibits special creep behavior (time dependent deformation behavior) at a low temperature that has not been known conventionally.

A creep initiation temperature (absolute temperature) of a general metal material is approximately 40% of the melting point (herein, expressed as "0.4 TM"). For example, in a case of silver, the melting point is 1235 K, so that 0.4 TM becomes 494 K (221° C.). In contrast, the actual creep initiation temperature of bulk silver is 479 K (206° C.), so that 0.4 TM may be regarded as a good approximation. Meanwhile, the present inventors have found that, in a case of the sintered body of silver fine particles of the present invention, creep behavior is exhibited even at room temperature 298 K (25° C.).

Figure 1:
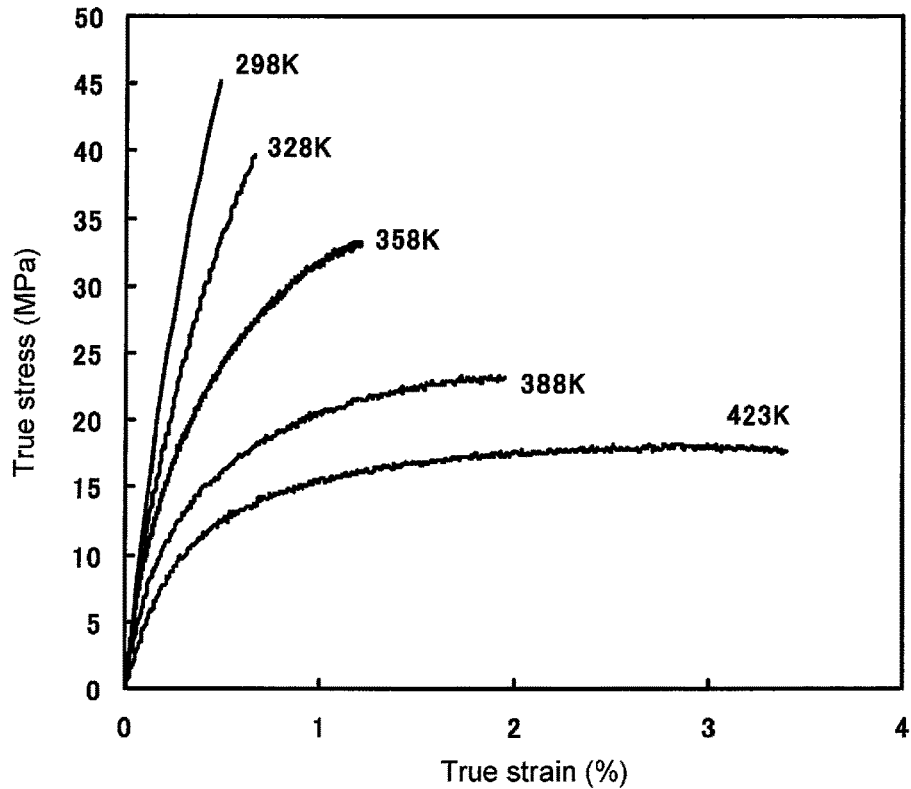
FIG. 1 is a diagram illustrating a curve of a true stress σ (the ordinate axis, MPa)—true strain ε (the abscissa axis, %) of a sintered body of silver fine particles in First Example.
Figure 2:
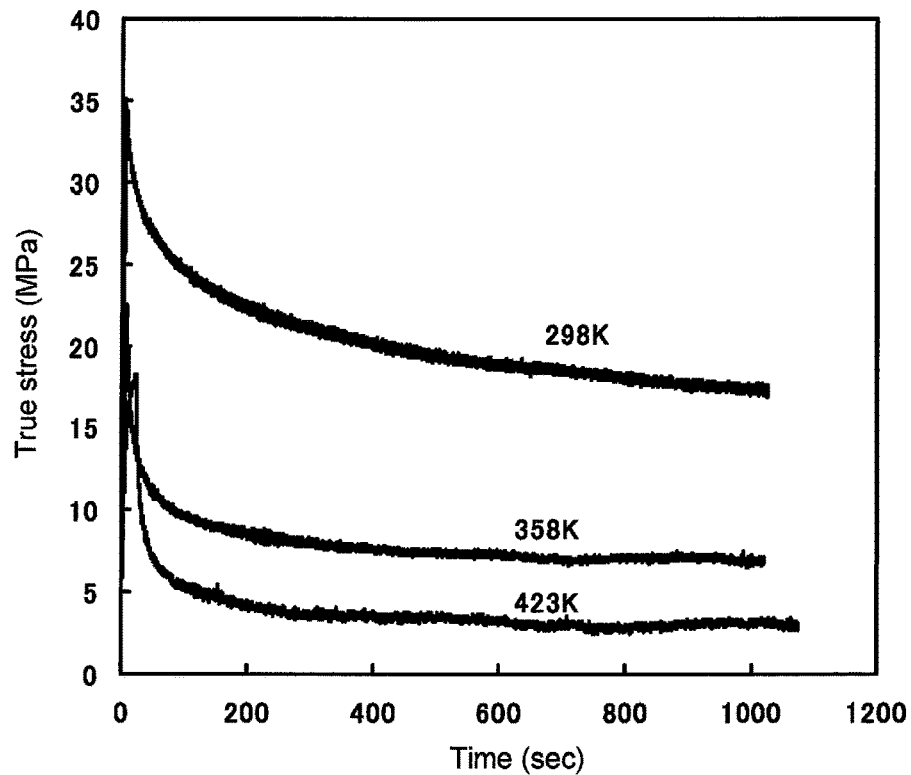
FIG. 2 is a diagram illustrating a stress relaxation test result of the sintered body of silver fine particles in First Example and a diagram with time (second) on the abscissa axis and with true stress σ (MPa) on the ordinate axis.

FIG. 1 illustrates a curve of a true stress-true strain of a sintered body of silver fine particles in First Example of the present invention. In addition, FIG. 2 illustrates creep behavior (time dependency of true stress) of the sintered body of silver fine particles in First Example of the present invention. The creep behavior illustrated in FIG. 2 may be regarded as exhibiting deformation behavior that is dependent on time (creep behavior) in a case of any measurement temperature of 298 K to 425 K (25° C. to 152° C.). That is, the sintered body of silver fine particles of the present invention may be regarded as, greatly different from mechanical characteristics (elasto-plastic properties) of bulk silver, having mechanical characteristics similar to a resin (viscoelastic properties). Accordingly, when the sintered body of silver fine particles of the present invention is used, it is possible to form a structure exhibiting metallic properties of being excellent in electrical conductivity and thermal conductivity while further having resin-like mechanical characteristics. Therefore, it is possible to preferably use the sintered body of silver fine particles of the present invention as a bonding member to bond components of a semiconductor device.

In the present invention, an activation energy for creep of the sintered body of silver fine particles is from 0.4 to 0.75 times that of an activation energy for lattice diffusion of bulk silver.

The "activation energy for creep" is an apparent activation energy for the sintered body of silver fine particles that may be obtained from the Arrhenius plot regarding the relationship of the steady state creep rate with the stress. The "activation energy for creep" corresponds to the activation energy for lattice diffusion in a case of bulk silver. As described above, the sintered body of silver fine particles of the present invention exhibits the creep behavior as mechanical behavior, so that the term "activation energy for creep" is used in a case of the sintered body of silver fine particles of the present invention.

In a case that the activation energy for creep of the sintered body of silver fine particles of the present invention is not more than 0.4 times that of the activation energy for the lattice diffusion of the bulk silver, it is not possible to obtain sintered body strength sufficient for a bonding member to bond components of the semiconductor device. In addition, in a case that the activation energy for creep of the sintered body of silver fine particles of the present invention is not less than 0.75 times that of the activation energy for the lattice diffusion of the bulk silver, it may be regarded as not possible to obtain sufficient creep behavior. Accordingly, in order that the sintered body of silver fine particles of the present invention exhibits predetermined effects as a bonding member to bond components of the semiconductor device, the activation energy for creep of the sintered body of silver fine particles is from 0.4 to 0.75 times, preferably from 0.4 to 0.7 times, more preferably from 0.5 to 0.7 times, and even more preferably from 0.53 to 0.63 times that of the activation energy for the lattice diffusion of the bulk silver. Since the activation energy for the lattice diffusion of the bulk silver is 190 KJ/mol, the activation energy for creep is from 76 to 142.5 KJ/mol, preferably from 76 to 133 KJ/mol, more preferably from 95 to 133 KJ/mol, and even more preferably from 100.7 to 199.7 KJ/mol.

In the sintered body of silver fine particles of the present invention, it is preferred that silver fine particles having an average particle diameter of primary particles from 40 to 350 nm, a crystallite diameter from 20 to 70 nm, and also a ratio of the average particle diameter to the crystallite diameter from 1 to 5 is sintered by heating at a temperature from 130 to 320° C. Descriptions are given to the silver fine particles that may be used as a raw material of the sintered body of silver fine particles of the present invention.

The silver fine particles that may be used as a raw material of the sintered body of silver fine particles of the present invention is silver fine particles characterized by (a) having an average particle diameter of primary particles from 40 to 350 nm, (b) having a crystallite diameter from 20 to 70 nm, and also (c) having a ratio of the average particle diameter to the crystallite diameter from 1 to 5.

The average particle diameter herein is an average particle diameter based on a particle number criterion by laser diffraction scattering particle size distribution measurement. In addition, the crystallite diameter herein is a result of calculation from the Scherrer equation by obtaining a half width of a speak from a plain of a plain index (1, 1, 1) from measurement by powder X-ray diffractometry using the Kα line of Cu as a radiation source.

The silver fine particles that may be used as a raw material of the sintered body of silver fine particles of the present invention has an average particle diameter of primary particles from 40 to 350 nm, preferably from 40 to 100 nm, more preferably from 50 to 80 nm. The silver fine particles that may be used as a raw material of the sintered body of silver fine particles of the present invention is usually approximately spherical. When the average particle diameter falls within this range, aggregation of the silver fine particles is suppressed, and storage stability is easily obtained in a case of being made into an electrically conductive paste, and it is preferred as a raw material to obtain a bonding member to bond components of a semiconductor device.

The silver fine particles that may be used as a raw material of the sintered body of silver fine particles of the present invention has a crystallite diameter from 20 to 70 nm and preferably from 20 to 50 nm. When the crystallite diameter falls within this range, volume contraction during firing is suppressed and also density and surface smoothness of a silver film formed after the firing. Therefore, the silver fine particles described above is preferred as a raw material to obtain a bonding member to bond components of a semiconductor device (the sintered body of silver fine particles of the present invention).

The silver fine particles that may be used as a raw material of the sintered body of silver fine particles of the present invention has a ratio of the average particle diameter to the crystallite diameter of a primary silver fine particles (average particle diameter/crystallite diameter) in a range from 1 to 5, preferably from 1 to 4, and more preferably from 1 to 3. It is even more preferred that a lower limit of the ratio of the average particle diameter is 1.5. When the ratio mentioned above falls within this range, it is preferred for a raw material of an electrically conductive paste exhibiting sufficient electrical conductivity at a firing temperature not more than 200° C.

It is possible to manufacture the silver fine particles that may be used as a raw material of the sintered body of silver fine particles of the present invention by mixing silver salt of carboxylic acid with aliphatic primary amine, and subsequently adding a reductant to precipitate silver fine particles at a reaction temperature from 20° C. to 80° C.

Firstly, silver salt of carboxylic acid is mixed with aliphatic primary amine to obtain a solution in which silver salt of carboxylic acid is dissolved. It is considered that, in the solution, aliphatic primary amine is coordinated to silver salt of carboxylic acid to form a sort of amine complex.

The silver salt of carboxylic acid may also be silver salt of either aliphatic or aromatic carboxylic acid. It may also be silver salt of monocarboxylic acid and silver salt of polycarboxylic acid, such as dicarboxylic acid. Silver salt of aliphatic carboxylic acid may also be silver salt of chain aliphatic carboxylic acid and may also be silver salt of cyclic aliphatic carboxylic acid. It is preferably silver salt of chain aliphatic monocarboxylic acid, and more preferably silver acetate, silver propionate, or silver butyrate, and particularly silver acetate. These may be used singly or two or more types together.

The aliphatic primary amine may also be chain aliphatic primary amine and may also be cyclic aliphatic primary amine. In addition, it may also be a monoamine compound and may also be a polyamine compound, such as a diamine compound.

The aliphatic primary amine may also include those having an alcoxy group, such as a hydroxyl group, a methoxy group, an ethoxy group, and a propyl group, substituting for the aliphatic hydrocarbon group. It is more preferably 3-methoxypropylamine, 3-aminopropanol, and 1,2-diaminocyclohexane. These may be used singly or two or more types together.

A used amount of aliphatic primary amine is determined from a requirement of process, such as post-process of silver fine particles to be generated, and an apparatus. From the perspective of obtaining silver fine particles having a controlled particle diameter, it is preferred that the used amount of aliphatic primary amine is 1 equivalent weight or more relative to 1 equivalent weight of silver salt of carboxylic acid. Considering influence of excessive aliphatic primary amine on the environment and the like, the used amount of aliphatic primary amine relative to 1 equivalent weight of silver salt of carboxylic acid is preferably from 1.0 to 3.0 equivalent weights, more preferably from 1.0 to 1.5 equivalent weights, and particularly preferably from 1.0 to 1.1 equivalent weights. Particularly, in a case of using the liquid in which silver fine particles are precipitated by the reductant directly as an electrically conductive paste in the following steps, there is a possibility that the excessive aliphatic primary amine is vaporized due to the heating. Therefore, it is especially desired to employ the preferred used amount mentioned above.

The mixing of silver salt of carboxylic acid and aliphatic primary amine may be carried out in the absence or in the presence of an organic solvent. By using an organic solvent, it is possible to facilitate the mixing. The organic solvent may include: alcohols, such as ethanol, propanol, and butanol; ethers, such as propylene glycol dibutyl ether; aromatic hydrocarbon, such as toluene; and the like. These may be used singly or two or more types together. A used amount of the organic solvent may be an arbitrary amount from the perspective of convenience of the mixing and productivity of silver fine particles in the following steps.

The mixing of silver salt of carboxylate and aliphatic primary amine is carried out by, for example, adding silver salt of carboxylic acid while stirring primary aliphatic amine or a mixture of primary aliphatic amine and the organic solvent. It is also possible to continue stirring appropriately after the addition. In the meantime, the temperature is maintained preferably from 20 to 80° C. and more preferably from 20 to 60° C.

After that, by adding a reductant, silver fine particles are precipitated. From the perspective of reaction control, the reductant is preferably formic acid, formaldehyde, ascorbic acid, or hydrazine and more preferably formic acid. These may be used singly or two or more types together.

A used amount of the reductant relative to silver salt of carboxylic acid is usually not less than an oxidation reduction equivalent weight, and the oxidation reduction equivalent weight is preferably from 0.5 to 5 times and more preferably from 1 to 3 times. In a case that the silver salt of carboxylic acid is silver salt of monocarboxylic acid and formic acid is used as the reductant, a used amount of formic acid in terms of moles relative to 1 mole of the silver salt of carboxylic acid is preferably from 0.5 to 1.5 moles, more preferably from 0.5 to 1.0 mole, and even more preferably from 0.5 to 0.75 moles.

In the addition of the reductant and the reaction after that, the temperature is maintained from 20° C. to 80° C. The temperature is preferably from 20 to 70 preferably and more preferably from 20 to 60° C. When the temperature falls within this range, particle growth of the silver fine particles is sufficient, the productivity is high, and secondary aggregation is also suppressed. The time taken for the addition of the reductant and the reaction after that depends on the scale of reaction apparatus and is usually from 10 minutes to 10 hours. In the addition of the reductant and the reaction after that, as needed, it is possible to add an organic solvent selected from: alcohols, such as ethanol, propanol, and butanol; ethers, such as propylene glycol dibutyl ether; and aromatic hydrocarbon, such as toluene, in addition.

In the addition of the reductant and the reaction after that, an amount (mol) of silver salt of carboxylic acid relative to total capacity (L) of the solution in which silver salt of carboxylic acid and aliphatic primary amine are mixed, the reductant, and the arbitrary organic solvent preferably falls within the range from 1.0 to 6.0 mol/L, more preferably from 2.0 to 5.0 mol/L, and even more preferably from 2.0 to 4.0 mol/L. When the concentration of silver salt of carboxylic acid falls within this range, it is possible to sufficiently stir the reaction liquid and remove reaction heat, so that the average particle diameter of the precipitated silver fine particles becomes appropriate. Further, it does not interfere with operations, such as sedimentation decantation and solvent substitution, in the following steps.

In a case that a solution in which silver salt of carboxylic acid and aliphatic primary amine are mixed and an arbitrary organic solvent are charged in a reaction vessel and a reaction is carried out in a semi batch method that continuously supplies a reductant, it is possible that an amount of precipitating silver fine particles per hour of the time required from the start of reductant addition to the end of reaction (per 1 L of total capacity of the solution in which silver salt of carboxylic acid and aliphatic primary amine are mixed, the reductant and the arbitrary organic solvent) falls within the range from 0.3 to 1.0 mol/h/L, so that the productivity is very high. In a case of performing the reaction in a continuous reaction method (continuous complete mixing vessel and flowing type), even higher productivity is obtained, which gives a great gain to industrial performance.

The silver fine particles thus obtained have narrow particle size distribution, and it is possible to make the geometric standard deviation not more than 2.0. The geometric standard deviation herein is a ratio (D84.3 value/D50 value) of 84.3% particle diameter (D84.3 value) relative to 50% particle diameter (D50 value) of a particle number criterion by laser diffraction scattering particle size distribution measurement.

The silver fine particles precipitated by the reaction may be isolated by being subject to sedimentation to remove a supernatant by decantation and the like or adding a solvent, such as alcohol like methanol, ethanol, or terpineol. The layer including the silver fine particles may be used directly as an electrically conductive paste. The electrically conductive paste has a silver content rate in the electrically conductive paste of preferably from 40 to 90 weight % and more preferably from 45 to 80 weight %.

It is possible to obtain the sintered body of silver fine particles of the present invention by separating the silver fine particles described above from the solvent for sintering at a predetermined temperature. However, for easiness of handling and the like, the sintered body of silver fine particles of the present invention is preferably obtained by, after printing or applying the electrically conductive paste containing the silver fine particles described above on a desired area in a substrate or the like in a conventionally known method, such as screen printing, sintering by heating at a predetermined temperature. In addition, it is also possible to obtain the sintered body of silver fine particles containing a resin by mixing the electrically conductive paste containing the silver fine particles described above with a resin, for example, a curable resin, such as an epoxy resin, and sintering by heating at a predetermined temperature. In this case, a void in the sintered body of silver fine particles turns out to be filled with a resin. The sintered body of silver fine particles of the present invention is capable of exhibiting sufficiently high electrical conductivity and also exhibiting special creep behavior even in a case of containing a resin, for example, a curable resin, such as an epoxy resin.

The heating temperature for sintering of an electrically conductive paste containing the silver fine particles or silver fine particles that may be used as a raw material of the sintered body of silver fine particles of the present invention is from 130 to 320° C., preferably from 140 to 320° C., more preferably from 150 to 300° C., and even more preferably from 150 to 200° C. In addition, a lower limit of the heating temperature for sintering is particularly preferably at 130° C., and an upper limit is particularly preferably at 250° C. The sintered body of silver fine particles obtained by firing at this heating temperature exhibits sufficiently high electrical conductivity (for example, specific resistance value from 1 to 10 μΩcm level) and also exhibits special creep behavior.

The heating time of the silver fine particles or an electrically conductive paste containing the silver fine particles that may be used as a raw material of the sintered body of silver fine particles of the present invention differs depending on the heating temperature. Generally, the heating time may fall within a range from 5 minutes to 60 minutes, preferably a range from 10 minutes to 30 minutes. As one example, in a case of heating an electrically conductive paste containing silver fine particles at a temperature of 200° C. in an atmosphere for sintering, the heating time is approximately 15 minutes and it is possible to obtain a sintered body of silver fine particles having special creep behavior and high electrical conductivity.

It is possible to carry out heating (firing) of the silver fine particles or an electrically conductive paste containing the silver fine particles that may be used as a raw material of the sintered body of silver fine particles of the present invention in an atmosphere. In a case of the electrically conductive paste, it is necessary to volatile and/or burn a solvent so that it is preferred to heat in an ambience containing, for example, in an oxygen ambience or atmosphere. As an apparatus for heating, it is possible to use a firing furnace, such as a known electrical furnace.

It is possible to obtain the sintered body of silver fine particles of the present invention by sintering as described above using the silver fine particles obtained as above as the primary particles. That is, a method of manufacturing a sintered body of silver fine particles of the present invention is a manufacturing method including sintering silver fine particles having an average particle diameter of primary particles from 40 to 350 nm, a crystallite diameter from 20 to 70 nm, and also a ratio of the average particle diameter to the crystallite diameter from 1 to 5 at a temperature from 120 to 300° C. By manufacturing a sintered body of silver fine particles using the silver fine particles described above as the primary particles, it is possible to surely obtain a bonding member to bond components of a semiconductor device that is capable of relieving stress on the semiconductor device and also has electrical conductivity.

The present invention is a semiconductor device including a semiconductor chip and a support, both bonded by a bonding member, wherein the bonding member is the sintered body of silver fine particles described above. When the sintered body of silver fine particles of the present invention is used as a bonding member (die attach material) to join a semiconductor chip and a support, the heat dissipation characteristics are very excellent, so that it is possible to efficiently diffuse heat generated from a semiconductor device. In addition, it is possible to use the sintered body of silver fine particles of the present invention as a highly thermally conductive die attach material that may be a substitute for lead solder.

The present invention is a semiconductor device including a first semiconductor chip, and a circuit board or a second semiconductor chip, both bonded via a bump, wherein part or all of the bump is the sintered body of silver fine particles described above. It is possible to use the sintered body of silver fine particles of the present invention as a bump of a semiconductor device. Particularly, it is preferred that the sintered body of silver fine particles of the present invention is used as a bump to join a semiconductor chip and a circuit board or to join two semiconductor chips (first and second semiconductor chips). In addition, it is also possible to use the sintered body of silver fine particles of the present invention as a part of a bump to join a semiconductor chip provided with a copper pillar bump. In addition, in a case that the semiconductor device has a structure where three or more semiconductor chips and silicon interposers are respectively connected with each other in a plurality of spots via a bonding material, it is possible to use the sintered body of silver fine particles of the present invention as a bonding material to join in the plurality of spots. When the sintered body of silver fine particles of the present invention exhibiting creep behavior is used as a bump of a semiconductor device, it is possible to prevent generation of defects, such as a crack, in the bump even in a case that stress is exerted on the bump. Even in a case that the stress exerted on the semiconductor device is increased greatly, it is possible to prevent destruction of the semiconductor device. In addition, the sintered body of silver fine particles of the present invention is has silver as a material, so that it is also possible to preferably use as a bump of a flip chip semiconductor device having a high calorific value. Further, it is possible to suppress electromigration even in a case of being used for a bump having high current density. In addition, since it is easy to form the sintered body of silver fine particles of the present invention, it is possible to obtain high productivity for manufacturing of a semiconductor device.

The present invention is a method of manufacturing a semiconductor device having a semiconductor chip and a support bonded by a bonding member.

The method of manufacturing a semiconductor device of the present invention includes supplying, on a support, an electrically conductive paste containing silver fine particles having an average particle diameter of primary particles from 40 to 350 nm, a crystallite diameter from 20 to 70 nm, and also a ratio of the average particle diameter to the crystallite diameter from 1 to 5. The support, such as a substrate to be used for the semiconductor device, is known. The method of supplying the electrically conductive paste on the support may include screen printing and the like. When the predetermined silver fine particles described above are used as a raw material as the bonding member to bond components of the semiconductor device, the heat dissipation characteristics are very excellent, so that it is possible to efficiently diffuse the heat generated from components of the semiconductor device.

The method of manufacturing a semiconductor device of the present invention includes placing the semiconductor chip on the support in alignment. It is possible to use a known method for the alignment and placement of the semiconductor chip.

The method of manufacturing a semiconductor device of the present invention includes making the support, the electrically conductive paste, and the semiconductor chip by heating at a temperature from 120 to 300° C. By heating the electrically conductive paste at a predetermined temperature, it is possible to arrange the sintered body of silver fine particles of the present invention exhibiting predetermined creep behavior as a bonding member for the support and the semiconductor chip. When the method of manufacturing a semiconductor device of the present invention is used, it is possible to relieve stress of bonding between the support and the semiconductor chip, so that it is possible to suppress a crack and the like occurring in the semiconductor device.

The present invention is method of manufacturing a semiconductor device having a bump.

The method of manufacturing a semiconductor device having a bump of the present invention includes supplying, to a semiconductor chip, an electrically conductive paste containing silver fine particles having an average particle diameter of primary particles from 40 to 350 nm, a crystallite diameter from 20 to 70 nm, and also a ratio of the average particle diameter to the crystallite diameter from 1 to 5. The method of supplying the electrically conductive paste to the semiconductor chip may include screen printing and the like.

The method of manufacturing a semiconductor device having a bump of the present invention includes making the semiconductor chip by heating at a temperature from 120 to 300° C. By heating the electrically conductive paste at a predetermined temperature, it is possible to arrange the sintered body of silver fine particles of the present invention exhibiting predetermined creep behavior as the bump of the semiconductor device. When the sintered body of silver fine particles of the present invention exhibiting predetermined creep behavior is used as the bump of the semiconductor device, it is possible to prevent generation of defects, such as a crack, in a bump even in a case that stress is exerted on the bump. In addition, it is possible to prevent destruction of the semiconductor device even in a case that stress exerted on the semiconductor device obtained by the manufacturing method of the present invention is greatly increased.

EXAMPLES

A sintered body of silver fine particles of the present invention is produced experimentally in the following procedure. That is, an electrically conductive paste containing silver fine particles is fabricated firstly, and then the electrically conductive paste is printed on a glass slide for firing.

A manufacturing method of an electrically conductive paste containing silver fine particles in First to Third Examples and First and Second Comparative Examples is as follows. In a 10 L reaction vessel made of glass, 3.0 kg (30.9 mol) of 3-methoxypropylamine was put. While the reaction temperature was kept at 45° C. or less while stirring, 5.0 kg (30.0 mol) of silver acetate was added. Although it became a transparent solution to be dissolved immediately after the addition, the solution became turbid gradually as the addition progresses, and it became a viscous solution in a greyish brown turbid color when the total amount was added. There, 1.0 kg (21.0 mol) of 95 weight % formic acid was dropped slowly. While rapid heat generation was observed immediately after the dropping, the reaction temperature was kept from 30 to 45° C. in the meantime. The viscous solution initially in a gray turbid color changed from brown to black. After the total amount was dropped, the reaction was finished. As the reaction mixture was left statically at 40° C., it was separated into two layers. The upper layer was a yellow transparent liquid, and black silver fine particles were sediment in the lower layer. In the liquid in the upper layer, a silver component was not contained. The liquid in the upper layer was removed by decantation and subjected to layer separation using methanol to obtain an electrically conductive paste of a silver content rate of 65 weight %.

When the average particle diameter and the crystallite diameter of the silver fine particles contained in the electrically conductive paste thus obtained were measured, the average particle diameter was 100 nm and the crystallite diameter was 40 nm. Accordingly, the ratio of the average particle diameter relative to the crystallite diameter of the silver fine particles was 2.5.

Figure 5:
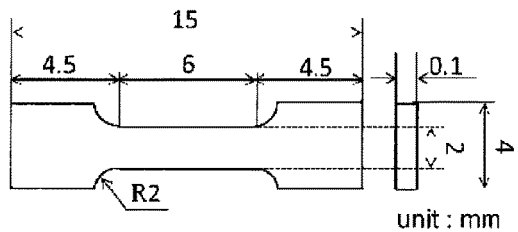
FIG. 5 is a schematic diagram of a mechanical test piece shape of the sintered body of silver fine particles.

The electrically conductive paste obtained as described above was printed on a glass slide so as to be in a mechanical test piece shape illustrated in FIG. 5 and fired by heating. The heating conditions were as illustrated in Table 1. That is, in a case of First Example, after keeping at 353 K (80° C.) for 30 minutes, it was heated at a heating temperature of 423 K (150° C.) for 30 minutes. By the heating, the silver fine particles were sintered to obtain the sintered body of silver fine particles in First Example. Similarly, in a case of Second and Third Examples and First and Second Comparative Examples, after keeping at 353 K (80° C.) for 30 minutes, it was heated at a predetermined heating temperature illustrated in Table 1 for 30 minutes.

The electrical resistivity and the thermal conductivity of samples in First to Third Examples and First and Second Comparative Examples were measured. The results are illustrated in Table 1. The thermal conductivity was measured by a laser flash method. In a case of the sintered body of silver fine particles in First Comparative Example, the strength of the setting film of the sintered body of silver fine particles was low, and it was not possible to measure the activation energy. In addition, in a case of the sintered body of silver fine particles in Second Comparative Example, the sintering contraction is large and a crack occurred in the setting film of the sintered body of silver fine particles, so that it was not possible to measure the activation energy.

TABLE 1

|  | Example 1 | Example 2 | Example 3 | Comparative example 1 | Comparative example 2 |
|---|---|---|---|---|---|
| Drying Temperature | 353 K (80° C.) | 353 K (80° C.) | 353 K (80° C.) | 353 K (80° C.) | 353 K (80° C.) |
| Drying Time (min) | 30 | 30 | 30 | 30 | 30 |
| Heating Temperature | 423 K (150° C.) | 473 K (200° C.) | 573 K (300° C.) | 393 K (120° C.) | 623 K (350° C.) |
| Heating Time (min) | 30 | 30 | 30 | 30 | 30 |
| Electrical Resistivity ($\mu\Omega \cdot cm$) | 4.20 | 2.9 | 2.2 | 8.2 | 2.0 |
| Thermal Conductivity (W/mK) | 126 | 180 | 282 | 76 | 302 |
| Activation Energy (KJ/mol) | 105 | 118 | 131 | Measurement Impossible (Due to Low Setting Film Strength) | Measurement Impossible (Due to Large Sintering Contraction and a Crack occurring in a Setting Film) |

The mechanical characteristics of the sintered body of silver fine particles in First Example were measured. Specifically, a constant strain rate tensile test and a stress relaxation test were carried out. For the mechanical testing machine, a micro mechanical testing machine employing a piezo device as the actuator was used. The tensile test was carried out at three criteria of strain rates of $10^{-1}$/second (/sec), $10^{-2}$/second, and $10^{-3}$/second and at five criteria of testing temperatures of 298 K, 328 K, 358 K, 388 K, and 423 K. In the stress relaxation test, after giving tensile strain up to 0.3 through 2.1% of nominal strain, the strain was kept for 1000 seconds.

FIG. 1 illustrates a curve of a true stress (the ordinate axis, MPa)—true strain (the abscissa axis, %) of the sintered body of silver fine particles in First Example. In addition, FIG. 2 illustrates a stress relaxation test result of the sintered body of silver fine particles in First Example. FIG. 2 illustrates time (second) on the abscissa axis and true stress (MPa) on the ordinate axis. The strain rate of the tensile test illustrated in FIG. 1 and FIG. 2 is $10^{-3}$/second. From the result illustrated in FIG. 1, it became clear that, in the sintered body of silver fine particles in First Example, with the increase in temperature, the elastic modulus and the stress decrease and viscous behavior appears. In addition, as illustrated in FIG. 2, in the sintered body of silver fine particles in First Example, the stress relaxation behavior was observed in the entire measurement temperature range from room temperature (298 K) to 423 K. That is, it became clear that, different from bulk silver, the sintered body of silver fine particles in First Example exhibited mechanical behavior like a resin material. From above, in the sintered body of silver fine particles in First Example, creep may be initiated at least at a temperature not more than the creep initiation temperature (206° C.) of the bulk silver. In silver materials, conventionally, there have been no reports exhibiting such mechanical behavior. Accordingly, the sintered body of silver fine particles of the present invention may be a new silver material exhibiting extremely interesting mechanical behavior.

Figure 3:
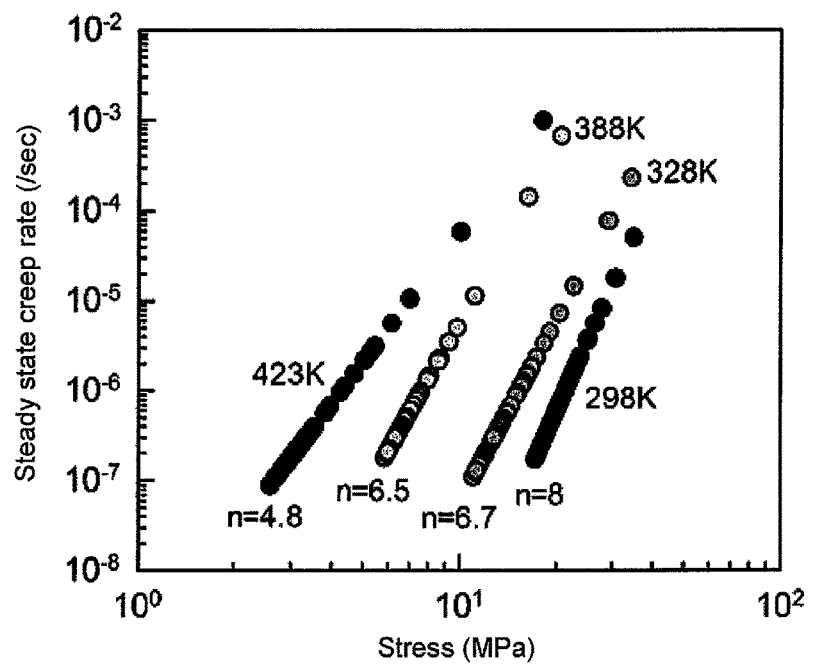
FIG. 3 is a diagram illustrating relationship of a steady state creep rate (the ordinate axis, /second) with stress (the abscissa axis, MPa) of the sintered body of silver fine particles in First Example.
Figure 4:
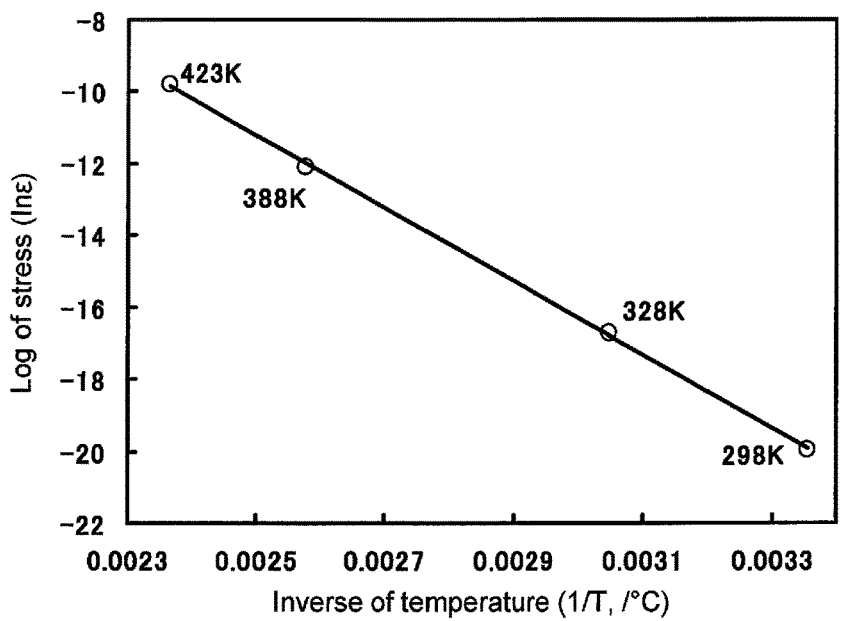
FIG. 4 is a diagram illustrating the Arrhenius plot regarding relationship of the steady state creep rate with the stress illustrated in FIG. 3.

FIG. 3 illustrates relationship of a steady state creep rate with stress of the sintered body of silver fine particles in First Example. In addition, FIG. 4 illustrates the Arrhenius plot regarding relationship of the steady state creep rate with the stress illustrated in FIG. 3. From analysis by the Arrhenius plot, the apparent activation energy (activation energy for creep) for the sintered body of silver fine particles in First Example is calculated as 105 KJ/mol. This value is 0.55 times that of the activation energy for lattice diffusion of bulk silver (190 KJ/mol).

Similar to First Example, from analysis by the Arrhenius plot, as the apparent activation energy (activation energy for creep) for the sintered body of silver fine particles in Second Example and Third Example is obtained, the activation energy for Second Example is calculated as 118 KJ/mol and the activation energy for Third Example as 131 KJ/mol. These values are 0.62 times (Second Example) and 0.69 times (Third Example) the activation energy for lattice diffusion of bulk silver (190 KJ/mol).

From the above results, different from the lattice diffusion of bulk silver, in the sintered body of silver fine particles in First to Third Examples, it may be assumed that creep by grain boundary diffusion is controlled in rate. That is, since the sintered body of silver fine particles of the present invention has a structure that easily diffuses the grain boundary structure, it may be assumed that the creep behavior is observed.

Accordingly, it became clear that the sintered body of silver fine particles of the present invention has extremely distinctive properties of exhibiting resin-like mechanical characteristics while electrical and heat transfer characteristics are metallic.

As described above, in a case of the sintered body of silver fine particles in First Comparative Example and Second Comparative Example, the problems of being low in the setting film strength and generation of a crack occur, so that it was not possible to measure the activation energy. That is, in a case that the heating temperature is not more than 393 K (120° C.), it became clear that a problem of being low in the setting film strength of the sintered body of silver fine particles occurred. In addition, in a case that the heating temperature for sintering is not less than 623 K (350° C.), it became clear that a problem of a crack occurring in a setting film of the sintered body of silver fine particles occurred.

Further, the following analysis was carried out regarding the sintered body of silver fine particles of the present invention.

Figure 6:
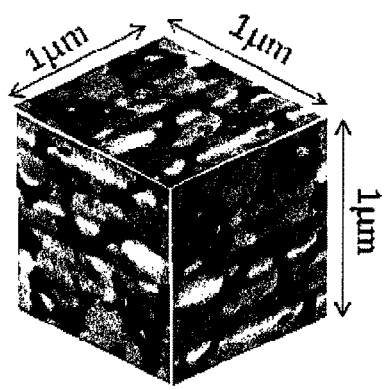
FIG. 6 is a diagram illustrating an internal structure of the sintered body of silver fine particles of the present invention with a secondary electron image by a scanning electron microscope.
Figure 7:
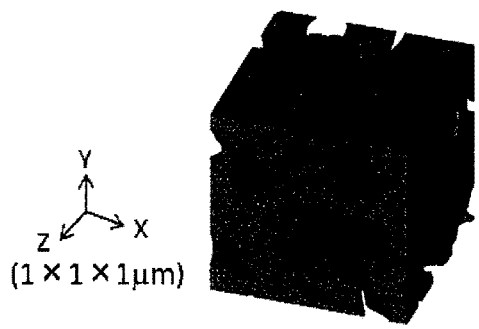
FIG. 7 is a schematic diagram illustrating an FEM model of the sintered body of silver fine particles.

In order to make the mechanical behavior of the sintered body of silver fine particles of the present invention clear, finite element method analysis (FEM) was carried out. FIG. 6 illustrates an internal structure of the sintered body of silver fine particles of the present invention (secondary electron image). Inside the sintered body of silver fine particles of the present invention, there are a large number of vacant pores. Therefore, the mechanical characteristics of a sintered test piece are apparent characteristics of a material including a large number of vacant pores, and do not exhibit the mechanical characteristics only of the silver sintered portion (dense portion). In order to consider details regarding the deformation mechanism of the sintered body of silver fine particles of the present invention, it is necessary to consider the deformation mechanism of the dense portion. Therefore, in the present analysis, the microstructure inside the sintered body of silver fine particles of the present invention is reproduced by an FEM model to obtain the characteristics of the silver dense portion by inverse analysis so as to match the apparent mechanical behavior. FIG. 7 illustrates an FEM model of the sintered body of silver fine particles of the present invention. A cross-sectional image obtained by cutting the sintered body of silver fine particles of the present invention at an interval of 15 nm using an FIB (Focused Ion Beam) is formed to make a microscale model of 1 μm square. The element type is a tetrahedron secondary element and the number of nodes is approximately 250 thousands. ANSYS ver.13 is used for the solver, and it is assumed that the sintered body of silver fine particles of the present invention follows the elasto-plastic creep behavior. The analysis is performed by combining a setting rule of two-line approximation and a steady state creep composition formula expressed in (1).

[Math 1]

$$\dot{\varepsilon}_{ss} = A\sigma^n \qquad (1)$$

Here, $\dot{\varepsilon}_{ss}$ is a steady state creep strain rate, A is a material constant, σ is stress, and n is a stress index. The elastic modulus and work-setting characteristics were obtained from the result obtained from the constant strain rate tensile test, and the creep characteristics is obtained by inverse analysis using the result obtained from the stress relaxation test.

Figure 8:
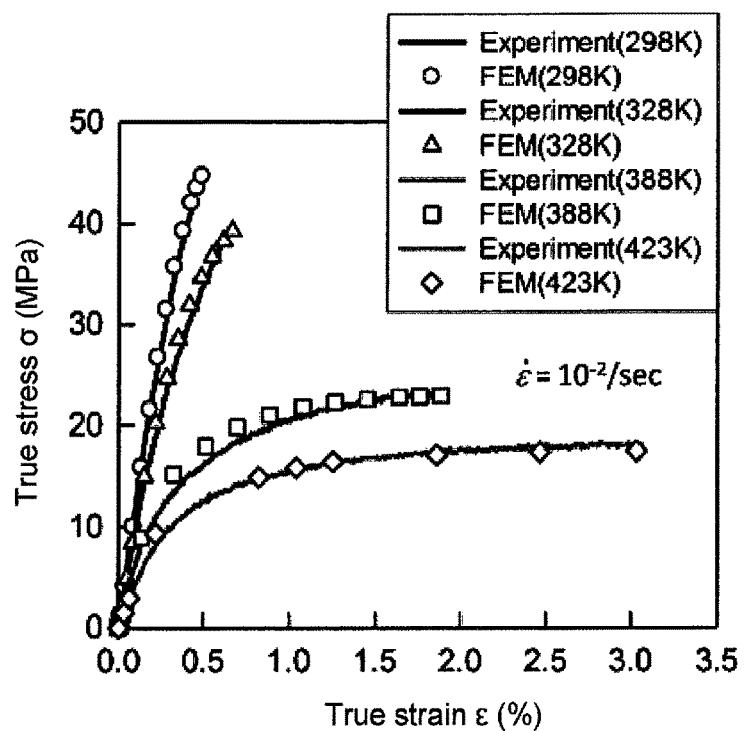
FIG. 8 is a diagram illustrating a curve of a true stress σ (the ordinate axis, MPa)—true strain ε (the abscissa axis, %) of the sintered body of silver fine particles in First Example, and a diagram illustrating experimental values (Experiment, solid lines) and a result of finite element method analysis (FEM).
Figure 9:
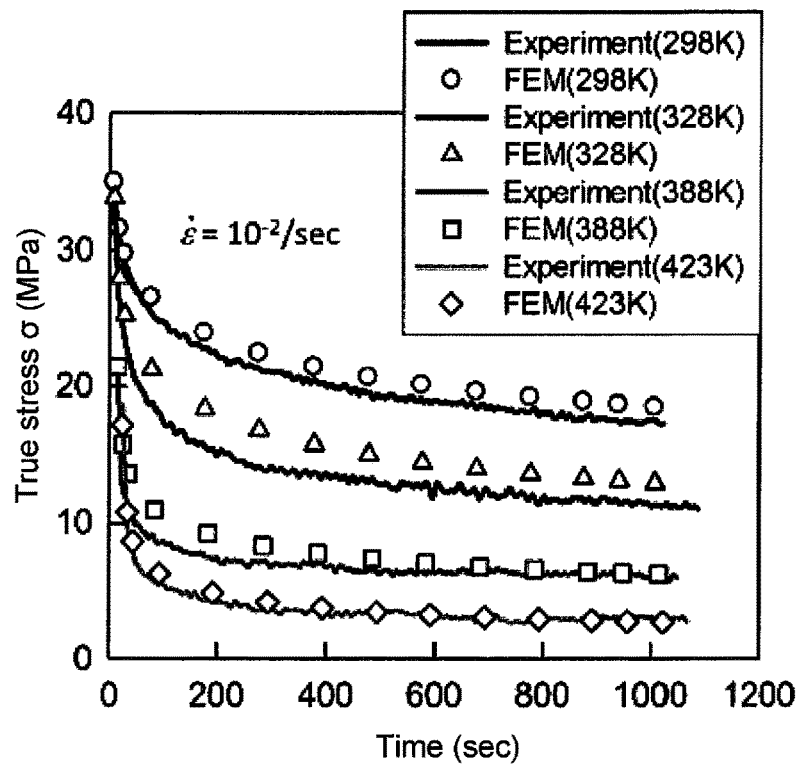
FIG. 9 is a diagram illustrating a stress relaxation test result of the sintered body of silver fine particles in First Example, and a diagram with time (second) on the abscissa axis and with true stress σ (MPa) on the ordinate axis, and a diagram illustrating experimental values (Experiment, solid lines) and a result of finite element method analysis (FEM).

FIG. 8 illustrates a tensile test result (solid line), and FIG. 9 illustrates a stress relaxation test result (solid line). Firstly, viewing the result of the tensile test, the sintered body of silver fine particles of the present invention exhibits linear behavior at around room temperature and becomes brittle behavior that breaks around 0.5% of true strain. In addition, in the sintered body of silver fine particles of the present invention, the stress decrease and also becomes non-linear behavior as the temperature rises. As exceeding 388 K, stress behavior becomes a dynamic recovery type and creep deformation is suggested. In addition, focusing on the elastic modulus, from the experiment result, it is 12.4 GPa at room temperature and extremely low in comparison with 76 GPa, which is the Young's modulus of bulk silver. The vacant pore rate of the sintered body of silver fine particles of the present invention is approximately 30%, and even when considering this, it is an extremely low value. This result suggests that the bonding of silver fine particles with each other is weaker than bulk silver.

Next, viewing the stress relaxation behavior of the sintered body of silver fine particles of the present invention, an interesting result of observing relief at room temperature of not more than 0.4 TM (temperature of 40% of the melting point in absolute temperature), which is an empirical rule of general creep appearance. Considering creeping at a low temperature in addition to the low Young's modulus, it is estimated that the bonding interface of the silver fine particles is in a special structure.

Figure 10:
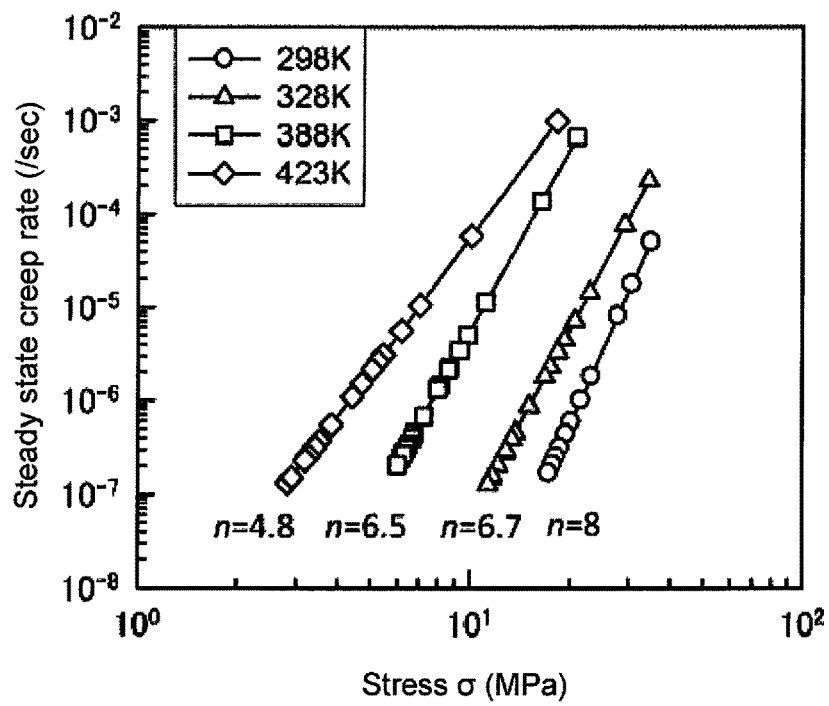
FIG. 10 is a diagram illustrating relationship of a steady state creep rate (the ordinate axis, /second) with stress σ (the abscissa axis, MPa) of the sintered body of silver fine particles in First Example.

In order to investigate such distinctive deformation mechanism, results of inverse analysis of the characteristics of the silver dense portion as an elasto-plastic creep using the microstructure FEM model illustrated in FIG. 7 are illustrated as void symbols in FIG. 8 and FIG. 9. FIG. 10 illustrates the creep characteristics in the silver dense portion obtained at this time. The stress index n, which is inclination in the drawing, takes a value from 4 to 8 in each temperature, so that the stress index exhibits such as dislocation creep. When a composition formula of this result is obtained by hyperbolic approximation, it becomes Formula (2).

[Math 2]

$$\dot{\varepsilon}_{ss} = 6 \times 10^7 [\sinh(0.08)]^{5.05} \exp\left(-\frac{105000}{RT}\right) \qquad (2)$$

Here, the units for the strain rate, the stress, the temperature, and the activation energy are $s^{-1}$ (/second), MPa, K, and J/mol, respectively. The activation energy for creep is, as a result of best fit using Formula (2), 105 kJ/mol and about half the activation energy for lattice diffusion of bulk silver (190 kJ/mol). From the perspective of diffusion, not the dislocation creep by lattice diffusion, but the grain boundary diffusion is considered as a rate control mechanism of creep. Considering this together with the low Young's modulus in comparison with the bulk silver as described before, it is considered that the bonding grain boundary of the silver fine particles has a relatively rough structure that facilitates diffusion even at a low temperature. It is considered that the sintered body of silver fine particles of the present invention has such rough grain boundary structure, which relates to the distinctive mechanical behavior to appear the creep at a low temperature.

From these results, the sintered body of silver fine particles of the present invention may be regarded as expected as a high melting point material that is capable of relieving the stress even at a relatively low temperature.

In the analysis described above, as a result of keen examination of the low temperature creep behavior of the sintered body of silver fine particles of the present invention, the followings became clear.

(1) While becoming brittle behavior at a low temperature, the sintered body of silver fine particles of the present invention becomes dynamic recovery stress behavior with increasing temperature. In addition, the Young's modulus is extremely low in comparison with the bulk silver and is an extremely low value even considering the vacant pore rate, so that it is considered that bonding of the silver fine particles with each other is weaker than the bulk silver.

(2) It was found that the sintered body of silver fine particles of the present invention relieves the stress from room temperature of not more than 0.4 TM, which is an empirical rule of general creep appearance, and that creep appears at a low temperature.

(3) In the creep of the present invention, grain boundary diffusion is considered as a rate control mechanism, and considered together with the low Young's modulus in comparison with silver bulk, it is estimated that the grain boundary of the silver fine particles has a relatively rough grain boundary structure that facilitates diffusion at a low temperature.

Fourth Embodiment

Next, a sintered body of silver fine particles in Fourth Embodiment was fabricated similar to First Example other than further mixing an epoxy resin as a curable resin with the electrically conductive paste in First Example for firing. The sintered body of silver fine particles in Fourth Embodiment includes a curable resin. For the epoxy resin, diglycidyl hexahydrophthalate was used. In addition, the amount of adding the epoxy resin was 3.5 parts by weight based on 100 parts by weight of the silver fine particles.

Figure 11:
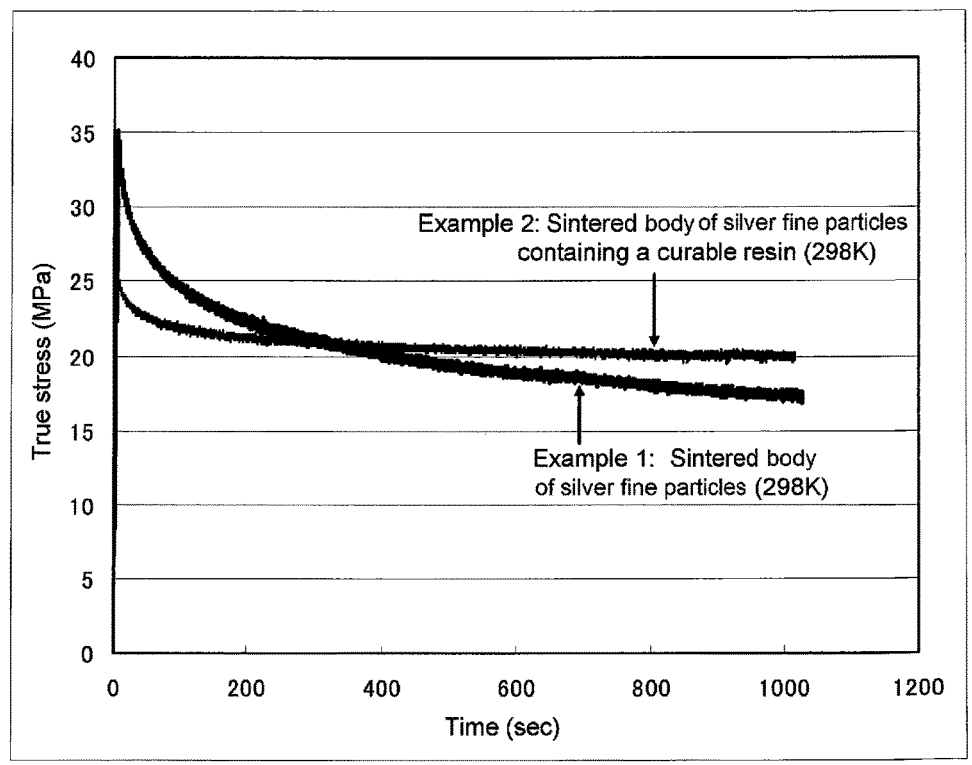
FIG. 11 is a diagram illustrating a stress relaxation test result of the sintered body of silver fine particles in First Example and a sintered body of silver fine particles containing a curable resin in Fourth Embodiment, and a diagram with time (second) on the abscissa axis and with true stress σ (MPa) on the ordinate axis.

FIG. 11 illustrates a stress relaxation test result of the sintered body of silver fine particles containing the curable resin in Fourth Embodiment. For comparison, FIG. 11 also illustrates the stress relaxation test result of the sintered body of silver fine particles in First Example. As clear from FIG. 11, in the sintered body of silver fine particles containing the curable resin in Fourth Embodiment, stress relaxation behavior similar to the sintered body of silver fine particles in First Example was observed. It became clear that the sintered body of silver fine particles in Fourth Embodiment exhibits the mechanical behavior as a resin material different from the bulk silver.

The invention claimed is:

1. A method of manufacturing a sintered body made from silver fine particles, the sintered body being operable to be a die attach material or a bump to bond components of a semiconductor device, the method comprising:
   sintering silver fine particles having an average particle diameter of primary particles of 40 to 350 nm, a crystallite diameter of 20 to 70 nm, and a ratio of the average particle diameter to the crystallite diameter of from 1 to 5, by heating the silver fine particles at a temperature of 130 to 320° C., so that the sintered silver fine particles becomes the die attach material or the bump,
   wherein the sintered body has an activation energy for creep which is 0.4 to 0.75 times that of an activation energy for a lattice diffusion of bulk silver, and
   wherein the silver fine particles are produced by mixing a silver salt of carboxylic acid with an aliphatic primary amine, or by mixing a silver salt of carboxylic acid with an aliphatic primary amine, and adding a reductant of formic acid to precipitate the silver fine particles.

2. The method according to claim 1, wherein the activation energy for creep of the sintered body is 0.4 to 0.7 times that of the activation energy for the lattice diffusion of the bulk silver.

3. The method according to claim 2, wherein the sintered body has a void which is filled with a resin.

4. The method according to claim 1, wherein the silver fine particles have a crystallite diameter of 20 to 50 nm, and a ratio of the average particle diameter to the crystallite diameter of from 1 to 4, and
   wherein the silver particles are sintered by heating at a temperature of 140 to 320° C.

5. The method according to claim 4, wherein the sintered body has a void which is filled with a resin.

6. The method according to claim 1, wherein the sintered body has a void which is filled with a resin.

7. A method of manufacturing a semiconductor device having a semiconductor chip and a support bonded by a die attach material formed of a sintered body made from silver fine particles, the method comprising:
   supplying, on a support, an electrically conductive paste containing the silver fine particles having an average particle diameter of primary particles of 40 to 350 nm, a crystallite diameter of 20 to 70 nm, and a ratio of the average particle diameter to the crystallite diameter of from 1 to 5;
   placing and aligning the semiconductor chip on the support; and sintering the support, the electrically conductive paste, and the semiconductor chip, by heating at a temperature of 130 to 320° C., so that the electrically conductive paste becomes the die attach material formed of the sintered body,
   wherein the sintered body has an activation energy for creep which is 0.4 to 0.75 times that of an activation energy for a lattice diffusion of bulk silver, and
   wherein the silver fine particles are produced by mixing a silver salt of carboxylic acid with an aliphatic primary amine, or by mixing a silver salt of carboxylic acid with an aliphatic primary amine, and adding a reductant of formic acid to precipitate the silver fine particles.

8. The method according to claim 7, wherein the activation energy for creep of the sintered body is 0.4 to 0.7 times that of the activation energy for the lattice diffusion of the bulk silver.

9. The method according to claim 8, wherein the sintered body has a void which is filled with a resin.

10. The method according to claim 7, wherein the silver fine particles have a crystallite diameter of 20 to 50 nm, and a ratio of the average particle diameter to the crystallite diameter of from 1 to 4, and
    wherein the silver particles are sintered by heating at a temperature of 140 to 320° C.

11. The method according to claim 10, wherein the sintered body has a void which is filled with a resin.

12. The method according to claim 7, wherein the sintered body has a void which is filled with a resin.

13. A method of manufacturing a semiconductor device having a bump formed of a sintered body made from silver fine particles, the method comprising:
    supplying, to a semiconductor chip, an electrically conductive paste containing the silver fine particles having an average particle diameter of primary particles of 40 to 350 nm, a crystallite diameter of 20 to 70 nm, and a ratio of the average particle diameter to the crystallite diameter of from 1 to 5; and
    sintering the semiconductor chip, by heating at a temperature of 130 to 320° C., so that the electrically conductive paste becomes the bump of the sintered body,
    wherein an activation energy for creep of the sintered body is 0.4 to 0.75 times that of an activation energy for a lattice diffusion of bulk silver, and
    wherein the silver fine particles are produced by mixing a silver salt of carboxylic acid with an aliphatic primary amine, or by mixing a silver salt of carboxylic acid with an aliphatic primary amine, and adding a reductant of formic acid to precipitate the silver fine particles.

14. The method according to claim 13, wherein the activation energy for creep of the sintered body is 0.4 to 0.7 times that of the activation energy for the lattice diffusion of the bulk silver.

15. The method according to claim 14, wherein the sintered body has a void which is filled with a resin.

16. The method according to claim 13, wherein the silver fine particles have a crystallite diameter of 20 to 50 nm, and a ratio of the average particle diameter to the crystallite diameter of from 1 to 4, and wherein the silver particles are sintered by heating at a temperature of 140 to 320° C.

17. The method according to claim 16, wherein the sintered body has a void which is filled with a resin.

18. The method according to claim 13, wherein the sintered body has a void which is filled with a resin.

\* \* \* \* \*